US008918572B2

(12) United States Patent
Lee et al.

(10) Patent No.: US 8,918,572 B2
(45) Date of Patent: Dec. 23, 2014

(54) MICRO SD CARD ADAPTER DEVICE FOR DYNAMICALLY SWITCHING REQUESTS BETWEEN A WIRELESS TRANSMISSION INTERFACE AND AN SD INTERFACE

(75) Inventors: Hsin-Kai Lee, Hsin-Chu (TW); Kok-Kong Lai, Hsin-Chu (TW); Hsiu-Chen Chuang, Hsin-Chu (TW); Eng-Tien Ee, Hsin-Chu (TW); Jen-Chiang Jiang, Hsin-Chu (TW); Yuan-Jhen Peng, Hsin-Chu (TW); Cecilia Chau, Hsin-Chu (TW); Kuang-I Hung, Hsin-Chu (TW); Yueh-Chih Hsu, Hsin-Chu (TW); Yung-Ti Chang, Hsin-Chu (TW); Guang-Li Wu, Hsin-Chu (TW)

(73) Assignee: Key ASIC, Inc., Hsin-Chu (TW)

( * ) Notice: Subject to any disclaimer, the term of this patent is extended or adjusted under 35 U.S.C. 154(b) by 267 days.

(21) Appl. No.: 13/547,523

(22) Filed: Jul. 12, 2012

(65) Prior Publication Data

US 2013/0268707 A1    Oct. 10, 2013

(30) Foreign Application Priority Data

Apr. 5, 2012    (TW) .............................. 101111955 A

(51) Int. Cl.
*H05K 7/10*    (2006.01)
*G06F 13/40*    (2006.01)
(52) U.S. Cl.
CPC .................................... *G06F 13/409* (2013.01)
USPC ........................................................ 710/301

(58) Field of Classification Search
CPC ........... G06F 1/26; G06F 1/30; G06F 13/409; G06F 13/4081
USPC ........................... 710/301–310; 713/300–340
See application file for complete search history.

(56) References Cited

U.S. PATENT DOCUMENTS

| | | | |
|---|---|---|---|
| 6,266,724 B1* | 7/2001 | Harari et al. ................... | 710/301 |
| 7,581,040 B2* | 8/2009 | Irisawa ............................ | 710/33 |
| 8,019,923 B2* | 9/2011 | Asfur ............................ | 710/301 |
| 8,661,171 B1* | 2/2014 | Krishnan et al. ............. | 710/100 |
| 2004/0103234 A1* | 5/2004 | Zer et al. ....................... | 710/301 |
| 2008/0077722 A1* | 3/2008 | Tang et al. ..................... | 710/260 |
| 2011/0185098 A1* | 7/2011 | Kim et al. ...................... | 710/301 |
| 2011/0238880 A1* | 9/2011 | Hirayama et al. ............ | 710/301 |
| 2011/0314198 A1* | 12/2011 | Liu et al. ....................... | 710/260 |
| 2011/0320668 A1* | 12/2011 | Liu ................................. | 710/301 |

* cited by examiner

Primary Examiner — Raymond Phan
(74) Attorney, Agent, or Firm — Rosenberg, Klein & Lee

(57) ABSTRACT

A card adapter device includes a card slot for receiving a micro SD card therein; a SD interface for coupling electrically to a portable electronic device; a processing chip including a dynamic switch coupled electrically to the card slot and the SD interface, and a processor unit coupled electrically to the dynamic switch; and a wireless transmission/reception interface coupled electrically to the dynamic switch. Upon receiving a first signal from the wireless transmission/reception interface, the dynamic switch detects an operation mode of the SD interface and upon detecting that the SD interface is in an idle mode, the processor unit converts the dynamic switch to be coupled electrically to the wireless transmission/reception interface, thereby enabling the dynamic switch to transfer the first signal to the card slot, which, in turn, enables the wireless transmission/reception interface to access into the SD card.

6 Claims, 1 Drawing Sheet

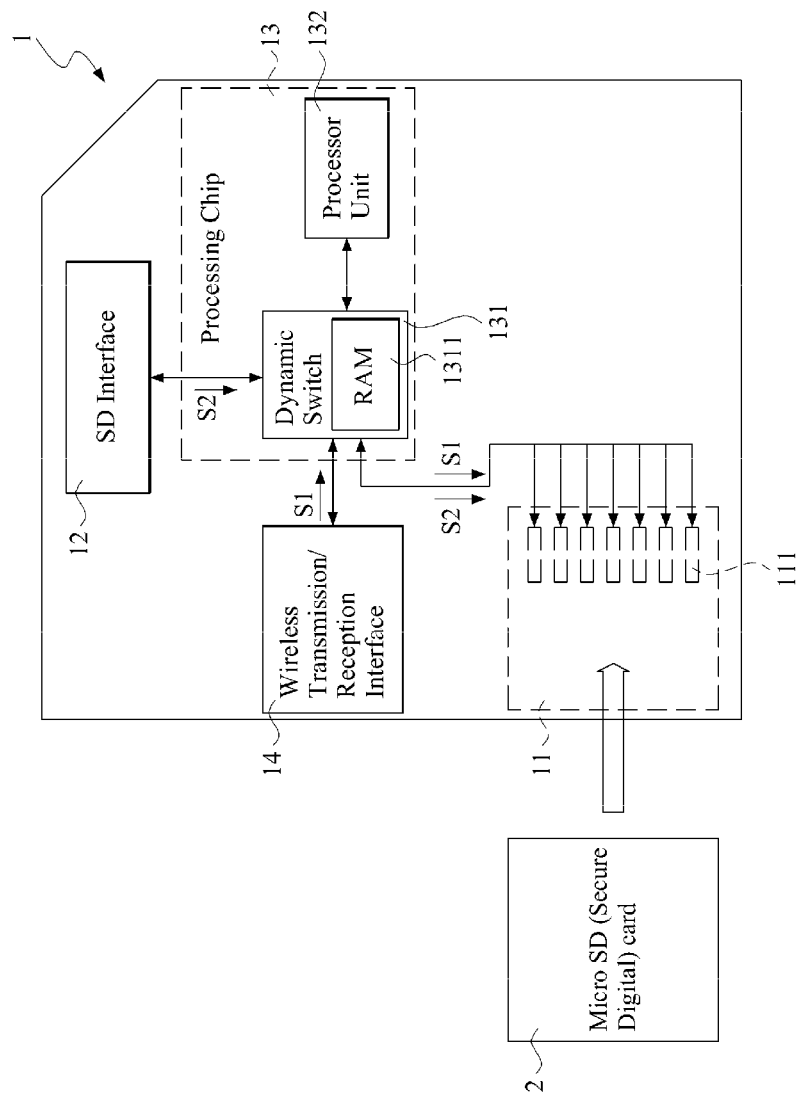

MICRO SD CARD ADAPTER DEVICE FOR DYNAMICALLY SWITCHING REQUESTS BETWEEN A WIRELESS TRANSMISSION INTERFACE AND AN SD INTERFACE

This application claims the benefits of the Taiwan Patent Application Serial No. 101111955, filed on Apr. 5, 2012, the subject matter of which is incorporated herein by reference.

BACKGROUND OF THE INVENTION

1. Field of the Invention

The present invention relates to a card adapter device, more particularly to a card adapter device, which includes a wireless transmission/reception interface and a processing chip.

2. Description of the Prior Art

Due to rapid advance in the electronic technology, it is in the trend to produce the electronic devices in compact size. In addition, the advance of wireless network technology, a plurality of electronic devices can transmit signal or data via the wireless network. Under such circumstance, the storage capacity of a memory card needs to be increased in order to accommodate the ever growing amount of data. For instance, a SD (Secure Digital) card utilized in a digital camera, the photographer usually transmits the shot photo (or image data) to his friends or blogs via the network. Alternately, he/she may transmit the image data to the PC (Personal Computer) for future use. It is noted that prior to transmission of the image data via the network, the photographer must stop the shooting operation and the SD card must be connected to the PC (via wire or wireless connection.)

Moreover, due to development of tablet computers and smart phones (hereinafter will be called portable electronic devices), the presently available storage cards or sticks are not compatible with the portable electronic devices owing to their different specifications and due to relatively compact size of the devices. When one desires to transmit data within a storage card of a portable electronic device (such as IPhone, IPad, Sensation or Galaxy S2 etc) to a smart phone, a card reader is required for coupling the storage card to the computer. Then only, he or she can transmit the data from the storage card into the computer. The user of the portable electronic device is much annoyed by this inconvenient process.

As it known to those skilled person in the art, according to the prior technology, the storage card can perform a single operation at one time and cannot perform several operation simultaneously. In other words, the storage card cannot capture image and transmit the image data simultaneously. In addition, the presently available storage cards or sticks are not applicable within the portable electronic devices of different specifications, thereby causing inconvenience to the user of the portable electronic device.

SUMMARY OF THE INVENTION

In the prior art technology, the storage card can only perform a single operation (transmission of image data) and cannot perform several operations simultaneously. The presently available storage cards or sticks are not applicable within the portable electronic devices of different specifications, thereby causing inconvenience to the user of the portable electronic device.

Therefore, the main objective of the present invention is to provide a card adapter device, which includes a card slot, a SD interface, a processing chip and a wireless transmission/reception interface. The processing chip further includes a dynamic switch coupled electrically to the card slot and the SD interface, and a processor unit coupled electrically to the dynamic switch in such a manner that a storage card received in the card slot can conduct several operations, such as transmission or reception of data via the wireless network.

The SD card adapter device of the present invention includes a card slot for receiving a micro SD (Secure Digital) card therein; a normal SD interface for coupling electrically to an electronic device; a processing chip including a dynamic switch that is connected to the card slot, and a wireless transmission/reception interface. In a condition, receiving a request to access the micro SD card from the wireless transmission/reception interface, the dynamic switch in the processing chip will immediately perform the arbitration of the request. The request will be granted if there is no on-going transaction from the transmission/reception interface from the electronic device to the micro SD card. The request from the wireless transmission/reception interface will only be granted only when the on-going data transaction is completed between the electronic device and the micro SD card if there is any. The priority of the arbitration of the request from the wireless transmission/reception interface and electronic device is configurable.

The dynamic switch consists of FIFO (first-in first-out) that will buffer the requests from both wireless interface module and electronic devices to be processed in order to improve the performance of the arbiter. As a result, the dynamic switch controls the transaction traffic dynamically between the wireless transmission/reception interface, the electronic device and also the micro SD storage that allows simultaneous activities in these three interfaces.

Preferably, the electronic device is selected from a group consisting of digital camera, PDA (Personal Digital Assistant), tablet computer, smart phone, laptop and any electronic device that has SD interface. In addition, the micro SD card slot is formed with a plurality of conductive terminals for electrically coupled to the micro SD card and the dynamic switch.

In addition, the wireless transmission/reception interface is selected from a group consisting of Wimax (Worldwide Interoperability for Microwave Access), Wi-Fi (Wi-Fi network), RF (Radio Frequency), Bluetooth, GPS (Global Positioning System) and GSM (Global System for Mobile Communication). The processor unit is selected from a group consisting of MCU (Multipoint Control Unit) and CPU (Central Processing Unit).

In comparison to the prior arts without the fast hardware dynamic switch, the storage card can only conduct a single operation at one time and cannot perform several operations simultaneously. In addition, the presently available SD storage card adapter does not have the processing unit with wireless capability.

BRIEF DESCRIPTION OF THE DRAWINGS

Other features and advantages of this invention will be described in more detail in the following detailed description of a preferred embodiment of this invention, with reference to the accompanying drawings, in which:

The FIGURE shows a block diagram representing the elements of a card adapter device of the present invention.

DETAILED DESCRIPTION OF THE PREFERRED EMBODIMENT

The micro SD card adapter device of the present invention is adapted to receive storage cards of different specifications. A preferred embodiment is given in following paragraphs for better understand of the present invention, however the scope of the present invention should not be limited to those given in the examples only.

Referring to the FIGURE, wherein the FIGURE shows a block diagram representing the elements of a card adapter device of the present invention. As shown, the micro SD card adapter device 1 of the present invention includes a micro SD card slot 11, a normal SD interface that connects to electronics devices 12, a processing chip with dynamic switch 13 and a wireless transmission/reception interface 14. The card slot 11 is formed with a plurality of conductive terminals 111 (only one is shown in the drawing) and is used for receiving a micro SD (Secure Digital) card 2 therein. The processing chip 13 includes a dynamic switch 131 and a processor unit 132. The dynamic switch 131 is coupled electrically to the micro SD card slot 11 such that the conductive terminals 111 extend into the card slot 11 so as to establish electrical communication with the dynamic switch 131. The processing chip 13 further includes a FIFO (first-in first-out) or RAM 1311 (Random Access Memory). The SD interface 12 and the processor unit 132 are electrically coupled to the dynamic switch 131, wherein the processor unit 132 is selected from a group consisting of MCU (Multipoint Control Unit) and CPU (Central Processing Unit).

The wireless transmission/reception interface 14 is coupled electrically to the dynamic switch 131, wherein the wireless transmission/reception interface 14 is selected from a group consisting of Wimax (Worldwide Interoperability for Microwave Access), Wi-Fi (Wi-Fi network), RF (Radio Frequency), Bluetooth, GPS (Global Positioning System) and GSM (Global System for Mobile Communication).

In one embodiment of the present invention, the SD interface 12 is coupled electrically to an electronic device (not visible) so that the conductive terminals 111 of the card slot 11 are in contact with a Micro SD (Secure Digital) card 2, thereby establishing electrical communication therebetween. Preferably, the electronic device is selected from a group consisting of a digital camera, a PDA (Personal Digital Assistant), a tablet computer and a smart phone.

If the electronic device presently employed is a digital camera, then the processor unit 132 is a CPU so that once the Micro SD card 2 is inserted into the card slot 11 the digital camera is electrically connected to the SD card 2 via the card adapter device 11 of the present invention. Under this condition, the SD interface 12 is electrically coupled with the digital camera while the conductive terminals 111 and the SD card 2 are in electrical communication relative to each other.

When a user wishes to transmit the data stored within the SD card 2 to a smart phone by utilizing the wireless transmission/reception interface 14 of the card adapter device of the present invention, the user only needs to activate the wireless transmission/reception interface 14, wherein the wireless transmission/reception interface 14 transmits a first signal 51 (i.e., a first request) to the dynamic switch 131 and the first signal 51 is stored temporarily in the RAM 1311. Under this condition, the dynamic switch 131 detects an operation mode of the SD interface 12 (i.e., to detect whether the digital camera is in use or not). Upon detecting that the SD interface 12 is in an idle mode (i.e., the digital camera is in use), the processor unit 132 converts the dynamic switch 131 to be coupled electrically to the wireless transmission/reception interface 14, thereby enabling the dynamic switch 131 to transfer the first signal 51 from the RAM 1311 into the card slot 11 (the SD card), which, in turn, enables the wireless transmission/reception interface 14 to access into the SD card 2. Since transmission of data from the smart phone to the SD card 2 in the card adapter device of the present works in the same manner, a detail description thereof is omitted herein for the sake of brevity.

Moreover, the user of the digital camera wishes to take photographs and simultaneously transmit the data from the Micro SD card 2 or vice versa. Under this condition, the user only needs to activate the SD interface 12, wherein the SD interface 12 transmits a second signal S2 (i.e., a second request) to the dynamic switch 13, where the second signal S2 is stored within the RAM 1311 and the dynamic switch 131 utilizing the second signal S2 to detect an operation mode of the wireless transmission/reception interface 14 and upon detecting that operation of the wireless transmission/reception interface 14 is interrupted, the processor unit 132 requests the dynamic switch 131 to be coupled electrically to the SD interface 12 so as to enable the dynamic switch 131 to transmit the second signal S2 from the RAM to the card slot 11, which, in turn, enables the SD interface 12 to access into the SD card 2. At this time, the image data captured by the digital camera is stored within the Micro SD card 2.

To make it short, whether the SD interface 12 transmits the second signal S2 or the wireless transmission/reception interface 14 transmit the first signal 51 to the dynamic switch 131, the latter will constantly detect the operation mode of the SD interface 12 or the wireless transmission/reception interface 14, where the processor unit 132 converts the state of the dynamic switch 131 depending on the operation mode of the former two, thereby achieving the intended features (transmission or reception of image data and taking of photographs by the digital camera can be conducted simultaneously).

As explained above, when the card adapter device of the present invention is used together with a portable electronic device, transmission and reception of data can be conducted via the wireless communication since the dynamic switch detects constantly the operation mode of the SD interface and the wireless transmission/reception interface, thereby switching the dynamic switch to be coupled electrically with either the SD interface of the wireless transmission/reception interface and enabling one of them to access the SD card in the card slot, hence providing convenience in transmission or storage of image data in the SD card.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A micro SD card adapter device for dynamically switching requests between a Wireless Transmission Interface and an SD Interface comprising:
   a micro SD (Secure Digital) card slot for receiving a micro SD card therein;
   a normal SD interface for coupling electrically to an electronic device;
   a processing chip including
      a dynamic switch coupled electrically to said card slot and said SD interface, and
      a processor unit coupled electrically to said dynamic switch; and
      a wireless transmission/reception interface coupled electrically to said dynamic switch;
   said processor unit being configured to receive a first request from said wireless transmission/reception interface to access data stored in said micro SD card, said processor unit detecting whether said SD interface is in electrical communication with said micro SD card slot, and upon detecting that said SD interface is not in electrical communication with said micro SD card slot, said processor unit accepts said first request from said wireless transmission/reception interface, thereby electrically coupling said dynamic switch to said wireless transmission/reception interface, whereby said dynamic switch is activated to transfer said first request to said card slot, whereby said wireless transmission/reception interface is coupled to said micro SD card slot to access data stored in said SD card, whereby said processor unit upon receipt of said first request from said wireless transmission/reception interface to access data stored in said micro SD card, determines whether to electrically couple said wireless transmission/reception interface to said micro SD card slot based on whether said SD interface is presently coupled to said micro SD card slot.

2. The card adapter device for dynamically switching requests between a Wireless Transmission Interface and a SD Interface according to claim 1, wherein said processing chip further includes a FIFO (first-in first-out) or RAM (Random Access Memory) functionality such that when upon acceptance of said first request from said wireless transmission/reception interface said dynamic switch is electrically coupled to said wireless transmission/reception interface, said SD interface transmits a second request to access said micro SD card, said processor unit is configured to initially store said second request within said FIFO or RAM and subsequent to storing said second request, said processor unit detects whether said wireless transmission/reception interface is presently in electrical communication with said micro SD card slot, and upon detecting that said wireless/transmission interface is not presently in electrical communication with said micro SD card slot said processor unit accepts said second request from said SD interface, whereby said dynamic switch is activated to transfer said second request from said RAM to said micro SD card slot, whereby said SD interface is coupled to said micro SD card slot so as to permit said SD interface to access into said micro SD card.

3. The card adapter device according to claim 1, wherein said wireless transmission/reception interface is selected from a group consisting of Wimax (Worldwide Interoperability for Microwave Access), Wi-Fi (Wi-Fi network), RF (Radio Frequency), Bluetooth, GPS (Global Positioning System) and GSM (Global System for Mobile Communication).

4. The card adapter device according to claim 1, wherein said processor unit is selected from a group consisting of MCU (Multipoint Control Unit) and CPU (Central Processing Unit).

5. The card adapter device according to claim 1, wherein said electronic device is selected from a group consisting of a digital camera, a PDA (Personal Digital Assistant), a tablet computer, a smart phone or any electronic device has SD interface.

6. The card adapter device according to claim 1, wherein said card slot is formed with a plurality of conductive terminals for electrically coupled to said SD card and said dynamic switch.

* * * * *